US012666710B2

(12) United States Patent
Kwon et al.

(10) Patent No.: US 12,666,710 B2
(45) Date of Patent: Jun. 23, 2026

(54) VERTICAL PN CONNECTION IN MULTI-STACK SEMICONDUCTOR DEVICE

(71) Applicant: SAMSUNG ELECTRONICS CO., LTD., Suwon-si (KR)

(72) Inventors: WookHyun Kwon, Hwaseong-si (KR); Byounghak Hong, Latham, NY (US); Sooyoung Park, Halfmoon, NY (US); Kang-ill Seo, Albany, NY (US)

(73) Assignee: Samsung Electronics Co., Ltd. (KR)

( * ) Notice: Subject to any disclaimer, the term of this patent is extended or adjusted under 35 U.S.C. 154(b) by 795 days.

(21) Appl. No.: 17/841,299

(22) Filed: Jun. 15, 2022

(65) Prior Publication Data

US 2023/0326926 A1     Oct. 12, 2023

Related U.S. Application Data

(60) Provisional application No. 63/329,726, filed on Apr. 11, 2022.

(51) Int. Cl.
H10D 84/85      (2025.01)
H10D 30/67      (2025.01)
H10D 62/10      (2025.01)

(52) U.S. Cl.
CPC ....... H10D 84/856 (2025.01); H10D 30/6713 (2025.01); H10D 30/6729 (2025.01);
(Continued)

(58) Field of Classification Search
CPC ........................................... H10D 62/118–123
See application file for complete search history.

(56) References Cited

U.S. PATENT DOCUMENTS

| 8,779,528 B2 | 7/2014 | Liaw |
| 8,859,372 B2 | 10/2014 | Liaw |

(Continued)

OTHER PUBLICATIONS

Communication issued Sep. 7, 2023 by the European Patent Office in counterpart European Patent Application No. 23165544.0.

*Primary Examiner* — Benjamin P Sandvik
(74) *Attorney, Agent, or Firm* — Myers Bigel, P.A.

(57)     ABSTRACT

A multi-stack semiconductor device includes: a substrate; a lower field-effect transistor including a lower channel structure, a lower gate structure surrounding the lower channel structure, and $1^{st}$ and $2^{nd}$ source/drain regions; and an upper field-effect transistor, on the lower field-effect transistor, including an upper channel structure, an upper gate structure surrounding the upper channel structure, and $3^{rd}$ and $4^{th}$ source/drain regions vertically above the $1^{st}$ and $2^{nd}$ source/drain regions, respectively, wherein the $1^{st}$ source/drain region is connected to one of a positive voltage source and a negative voltage source, and the $3^{rd}$ source/drain region is connected to the other of the positive voltage source and the negative voltage source, and wherein a top portion of the $2^{nd}$ source/drain region and a bottom portion the $4^{th}$ source/drain region are connected to each other.

20 Claims, 19 Drawing Sheets

(52) U.S. Cl.
  CPC ..... *H10D 30/6735* (2025.01); *H10D 30/6757*
  (2025.01); *H10D 62/118* (2025.01)

(56) References Cited

U.S. PATENT DOCUMENTS

| | | | |
|---|---|---|---|
| 9,036,404 B2 | 5/2015 | Liaw | |
| 9,653,457 B2 | 5/2017 | Guo et al. | |
| 9,711,501 B1 | 7/2017 | Basker et al. | |
| 10,388,569 B1 | 8/2019 | Cheng et al. | |
| 11,158,634 B1 | 10/2021 | Huang et al. | |
| 11,171,136 B2 | 11/2021 | Kim et al. | |
| 11,195,794 B2 | 12/2021 | Do | |
| 11,239,236 B2 | 2/2022 | Lilak et al. | |
| 11,315,933 B2 | 4/2022 | Wen et al. | |
| 2018/0053763 A1 | 2/2018 | Lin et al. | |
| 2018/0090582 A1* | 3/2018 | Adusumilli | H10D 30/62 |
| 2019/0181224 A1* | 6/2019 | Zhang | H10D 64/017 |
| 2020/0020768 A1* | 1/2020 | Lee | H10D 62/121 |
| 2020/0126987 A1 | 4/2020 | Rubin et al. | |
| 2020/0144122 A1 | 5/2020 | Cheng et al. | |
| 2020/0258881 A1 | 8/2020 | Lilak et al. | |
| 2020/0294969 A1 | 9/2020 | Rachmady et al. | |
| 2020/0402984 A1* | 12/2020 | Reznicek | H01L 21/02532 |
| 2021/0036690 A1 | 2/2021 | Tang | |
| 2021/0098500 A1* | 4/2021 | Wang | H10D 88/00 |
| 2021/0184000 A1 | 6/2021 | Ramaswamy et al. | |
| 2021/0242205 A1 | 8/2021 | Wu et al. | |
| 2021/0296315 A1* | 9/2021 | Lilak | H10D 88/01 |
| 2021/0343715 A1* | 11/2021 | Wu | H10D 84/853 |
| 2021/0366906 A1 | 11/2021 | Huang et al. | |
| 2022/0093489 A1 | 3/2022 | Do et al. | |
| 2025/0126885 A1* | 4/2025 | Seol | H10D 84/833 |

* cited by examiner

<u>10</u>

60

VERTICAL PN CONNECTION IN MULTI-STACK SEMICONDUCTOR DEVICE

CROSS-REFERENCE TO RELATED APPLICATION

This application is based on and claims priority from U.S. Provisional Application No. 63/329,726 filed on Apr. 11, 2022 in the U.S. Patent and Trademark Office, the disclosure of which is incorporated herein in its entirety by reference.

BACKGROUND

1. Field

Apparatuses consistent with example embodiments of the disclosure relate to a multi-stack semiconductor device having a vertical PN connection structure between an upper source/drain region and a lower source/drain region.

2. Description of the Related Art

In an effort to enhance performance and device density of a semiconductor device, a multi-stack or three-dimensional-stack semiconductor device (hereafter, collectively "multi-stack semiconductor device") has been developed. For example, two field-effect transistors may be formed at a lower stack and an upper stack, respectively, to constitute a multi-stack semiconductor device. Here, the lower-stack field-effect transistor and the upper-stack field-effect transistor may each be a gate-all-around (GAA) transistor such as a fin field-effect transistor (FinFET) or a nanosheet transistor which is also referred to as multi-bridge channel field-effect transistor (MBCFET).

However, as a plurality of connections or contact structures connecting the lower-stack field-effect transistor and the upper-stack field-effect transistor to power sources and other circuit elements are also required in completing the multi-stack semiconductor device, the structure of the multi-stack semiconductor device itself and a manufacturing process thereof become more complicated and expose various challenges.

Information disclosed in this Background section has already been known to the inventors before achieving the embodiments of the present application or is technical information acquired in the process of achieving the embodiments. Therefore, it may contain information that does not form the prior art that is already known to the public.

SUMMARY

The disclosure provides a semiconductor device having a stepped nanosheet structure having different channel region widths between nanosheet layers.

According to embodiments, there is provided a multi-stack semiconductor device that may include: a substrate; a lower field-effect transistor including a lower channel structure, a lower gate structure surrounding the lower channel structure, and $1^{st}$ and $2^{nd}$ source/drain regions; and an upper field-effect transistor, on the lower field-effect transistor, including an upper channel structure, an upper gate structure surrounding the upper channel structure, and $3^{rd}$ and $4^{th}$ source/drain regions vertically above the $1^{st}$ and $2^{nd}$ source/drain regions, respectively, wherein the $1^{st}$ source/drain region is connected to one of a positive voltage source and a negative voltage source, and the $3^{rd}$ source/drain region is connected to the other of the positive voltage source and the negative voltage source, and wherein a top portion of the $2^{nd}$ source/drain region and a bottom portion the $4^{th}$ source/drain region are connected to each other.

According to an embodiment, the $4^{th}$ source/drain region and the $2^{nd}$ source/drain region may be directly connected to each other to form a PN junction having a voltage barrier.

According to an embodiment, the multi-stack semiconductor device may further include a connection structure between the bottom portion of the $4^{th}$ source/drain region and the top portion of the $2^{nd}$ source/drain region, the connection structure connecting the $4^{th}$ source/drain region to the $2^{nd}$ source/drain region based on an ohmic contact. Here, the connection structure may be formed of a metal, a metal compound or silicon, wherein the $4^{th}$ source/drain region includes metal ion implantation contacting the connection structure, and the $2^{nd}$ source/drain region includes another metal ion implantation contacting the connection structure.

According to embodiments, there is provided a multi-stack semiconductor device that may include: a lower-stack transistor structure which is one of a p-type and an n-type; and an upper-stack transistor structure which is the other of the p-type and the n-type, wherein a $1^{st}$ source/drain region of the lower-stack transistor structure is provided vertically below a $2^{nd}$ source/drain region of the upper-stack transistor structure, and wherein the $1^{st}$ source/drain region and the $2^{nd}$ source/drain region are directly connected to each other without an external contact or connection structure.

According to embodiments, there is provided a multi-stack semiconductor device that may include: a lower-stack transistor structure which is one of a p-type and an n-type; and an upper-stack transistor structure which is the other of the p-type and the n-type, wherein a $1^{st}$ source/drain region of the lower-stack transistor structure is provided vertically below a $2^{nd}$ source/drain region of the upper-stack transistor structure, wherein the $1^{st}$ source/drain region and the $2^{nd}$ source/drain region are connected to each other through a connection structure forming an ohmic contact between the $1^{st}$ and $2^{nd}$ source/drain regions, and wherein the connection structure may be formed of a metal, a metal compound or silicon.

The structural characteristics of the disclosed multi-stack semiconductor device according to the embodiments may provide at least a more simplified manufacturing process and an increased device density.

BRIEF DESCRIPTION OF DRAWINGS

The embodiments of the disclosure will be more clearly understood from the following detailed description taken in conjunction with the accompanying drawings in which.

DETAILED DESCRIPTION

Figure 1A:
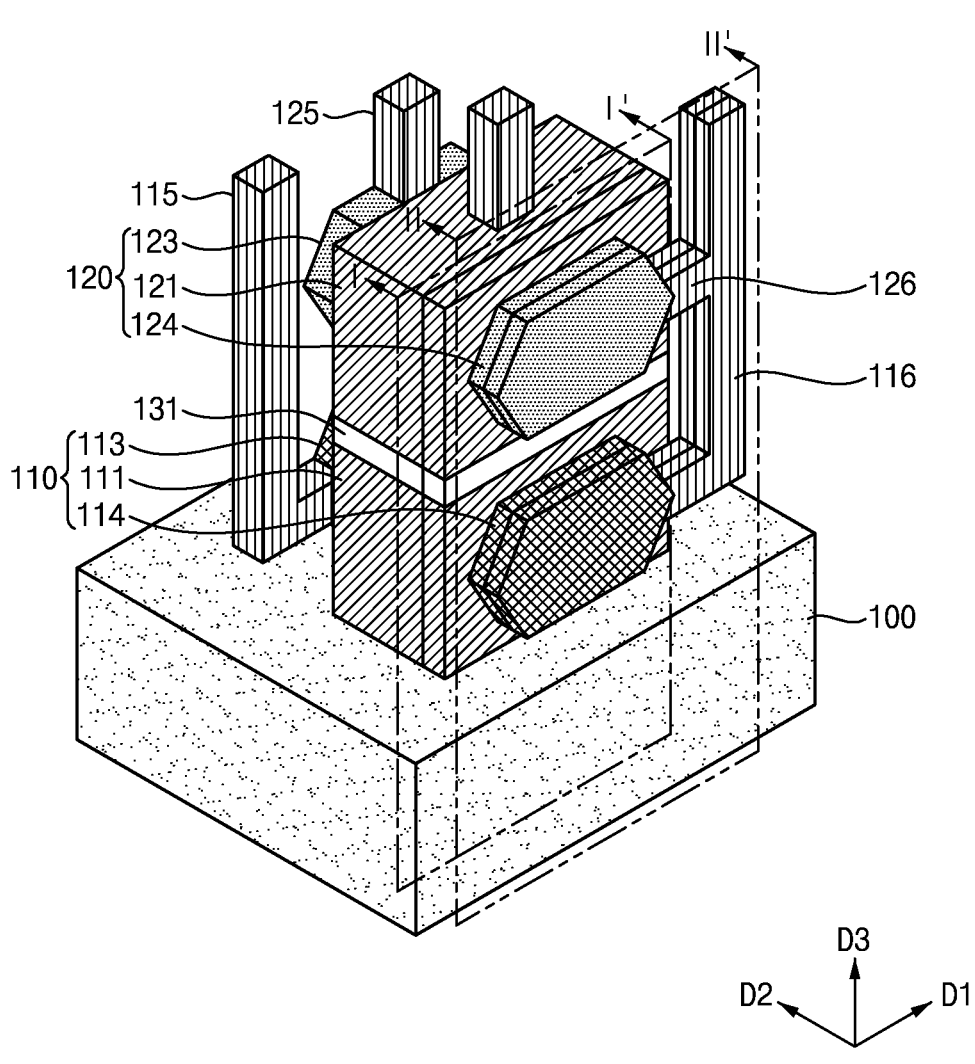
FIG. 1A illustrates a perspective view of a multi-stack semiconductor device including lower and upper field-effect transistors, according to an embodiment.

The embodiments described herein are example embodiments, and thus, the disclosure is not limited thereto, and may be realized in various other forms. Each of the embodiments provided in the following description is not excluded from being associated with one or more features of another example or another embodiment also provided herein or not provided herein but consistent with the disclosure. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the disclosure are intended to encompass structural and functional equivalents thereof. In addition, these equivalents should be understood as including not only currently well-known equivalents but also equivalents to be developed in the future, that is, all devices invented to perform the same functions regardless of the structures thereof.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "upper," "lower," "top," "bottom," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is flipped upside town or turned over, elements described as "below" or "beneath" other elements would then be oriented "above" the other elements, and a "top" or "upper" surface of an element would be a "bottom" or "lower" surface of the element. Thus, for example, the term "below" can encompass both an orientation of above and below, and the term "top" can encompass both a position of top and bottom, subject to the corresponding situation. The semiconductor device may be otherwise oriented (rotated 90 degrees or at other orientations) and the spatially relative descriptors used herein interpreted accordingly.

It will be understood that, although the terms first ($1^{st}$), second ($2^{nd}$), third ($3^{rd}$), fourth ($4^{th}$) etc. may be used herein to describe various elements, these elements should not be limited by these terms. These terms are only used to distinguish one element from another element. Thus, even if a "second ($2^{nd}$)" element is recited in the claims without a "first a first ($1^{st}$)" element in the specification or claims, the "second ($2^{nd}$)" element may still distinguish from another element, and a "second ($2^{nd}$)" element described in the specification may be termed as a "first ($1^{st}$)" element in the claims.

As used herein, expressions such as "at least one of," when preceding a list of elements, modify the entire list of elements and do not modify the individual elements of the list. For example, the expression, "at least one of a, b, and c" should be understood as including only a, only b, only c, both a and b, both a and c, both b and c, or all of a, b, and c.

It will be also understood that, even if a certain step or operation of manufacturing an apparatus or structure is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, some conventional elements of a semiconductor device may or may not be described in detail herein or shown in the drawings. For example, a spacer, a shallow trench isolation (STI) structure, etc. that are formed to insulate or isolate a transistor or its element from another transistor or another element of the transistor may not be described or shown.

Figure 1B:
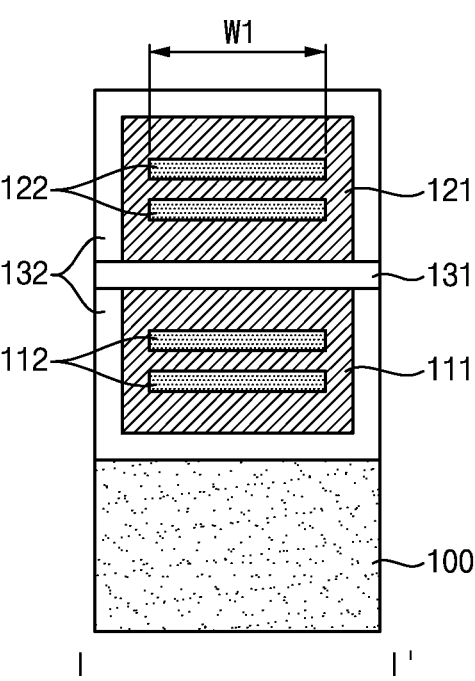
FIG. 1B illustrates a cross-sectional view of the multi-stack semiconductor device of FIG. 1A taken along a line I-I' shown in FIG. 1A.
Figure 1C:
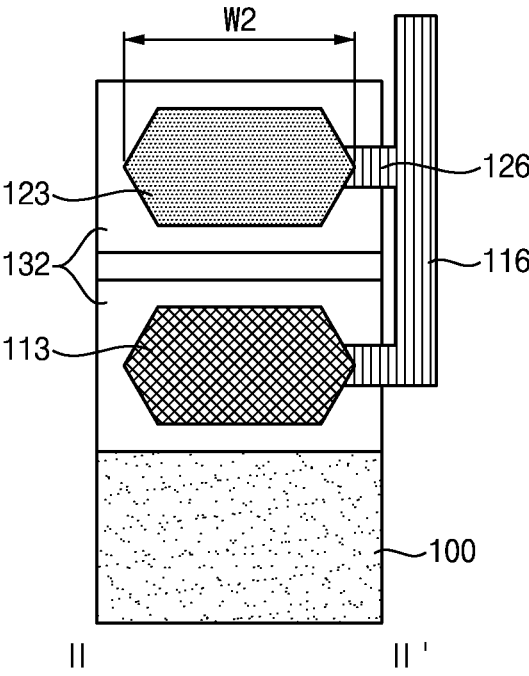
FIG. 1C illustrates a cross-sectional view of the multi-stack semiconductor device of FIG. 1A taken along a line II-II' shown in FIG. 1A, according to an embodiment.
Figure 1D:
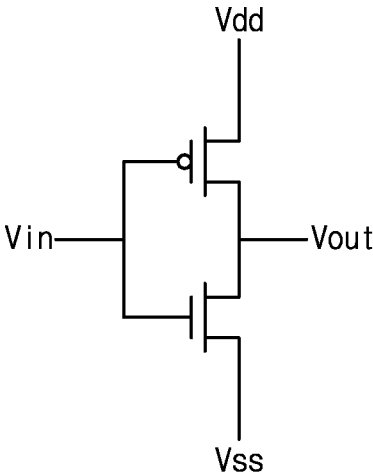
FIG. 1D illustrates a circuit schematic of an inverter circuit formed by the multi-stack semiconductor device of FIGS. 1A to 1C, according to an embodiment.

FIG. 1A illustrates a perspective view of a multi-stack semiconductor device including lower and upper field-effect transistors, according to an embodiment. FIG. 1B illustrates a cross-sectional view of the multi-stack semiconductor device of FIG. 1A taken along a plane I-I' shown in FIG. 1A, according to an embodiment. FIG. 1C illustrates a cross-sectional view of the multi-stack semiconductor device of FIG. 1A taken along a plane II-II' shown in FIG. 1A, according to an embodiment. FIG. 1D illustrates a circuit schematic of an inverter circuit formed by the multi-stack semiconductor device of FIGS. 1A to 1C, according to an embodiment.

According to FIGS. 1A and 1B, a multi-stack semiconductor device 10 may include a substrate 100, a lower field-effect transistor 110 formed on the substrate 100, and an upper field-effect transistor 120 stacked above the lower nanosheet transistor 110 on the substrate 100. The substrate 100 may be a bulk substrate of a semiconductor material, for example, silicon (Si), silicon-germanium (SiGe) or a silicon-on-insulator (SOI) substrate, not being limited thereto.

The lower field-effect transistor 110 formed at a lower stack on the substrate 100 may include a lower gate structure 111 surrounding a lower channel structure 112 formed of a plurality nanosheet layers stacked in a D3 direction and extended in D1 and D2 directions. Here, the D1, D2 and D3 directions are perpendicular to one another. At both ends of the lower channel structure 112 in the D2 direction, a $1^{st}$ source/drain region 113 and a $2^{nd}$ source/drain region 114 may be formed respectively to be connected through the lower channel structure 112 that functions as a current flow channel of the lower field-effect transistor 110.

Similarly, the upper field-effect transistor 120 formed at an upper stack above the lower field-effect transistor 110 may include an upper gate structure 121 surrounding an upper channel structure 122 formed of a plurality nanosheet layers stacked in the D3 direction and extended in the D1 and D2 directions. At both ends of the upper channel structure 122 in the D2 direction, a $3^{rd}$ source/drain region 123 and a $4^{th}$ source/drain region 124 may be formed respectively to be connected through the upper channel structure 122 that function as a current flow channel of the upper field-effect transistor 120.

The gate structures 111 and 121 may be isolated from each other by an isolation layer 131 formed between the lower and upper stacks of the multi-stack semiconductor device 10. The multi-stack semiconductor device 10 may also include an interlayer dielectric (ILD) layer that insulates the multi-stack semiconductor device 10 from another device such as another multi-stack semiconductor device. The isolation layer 131 and the ILD layer may be formed of silicon oxide (SiO), silicon nitride (SiN) and/or silicon oxynitride (SiON), not being limited thereto.

As shown in FIGS. 1B and 1C, the nanosheet layers forming the channel structures 112 and 122 may have a same width W1 in the D1 direction, and the $1^{st}$ to $4^{th}$ source/drain regions 113, 114, 123 and 124 grown from the channel structures 112 and 122 may have a same width W2 in the D1 direction. Further, the same number of the nanosheet layers may form each of the channel structures 112 and 122. Thus, the respective amounts of current flowing through the channel structures 112 and 122 in a unit time may be equal to each other. Although FIG. 1B shows that the number of the nanosheet layers forming each of the channel structures 112 and 122 is two (2), more than two nanosheet layers having the same width may form each of the channel structure 112 and 122 according to embodiments.

In some embodiments, the nanosheet layers forming the channel structures 112 and 122 may be formed of a material(s) the same as or different from a material(s) forming the substrate 100, and may be obtained through a number of manufacturing steps including photolithography and subtractive etching, not being limited thereto. The $1^{st}$ to $4^{th}$ source/drain regions 113, 114, 123 and 124 may be obtained by epitaxial growth of the substrate 100 and/or the channel structures 112 and 122, and thus, the $1^{st}$ to $4^{th}$ source/drain regions 113, 114, 123 and 124 may also include the material forming the substrate 100 and the channel structures 112 and 122. Each of the gate structures 111 and 121 may consist of a plurality layers including a work function metal layer and a gate electrode layer. The work function metal layer may include titanium (Ti), tantalum (Ta), or their compound, and the gate electrode may include copper (Cu), aluminum (Al), tungsten (W), molybdenum (Mo), ruthenium (Ru) or their compound, not being limited thereto. The gate structures 111 and 121 may be formed through a process such as atomic layer deposition (ALD), chemical vapor deposition (CVD), physical vapor deposition (PVD), plasma-enhanced CVD (PECVD), reactive ion etching (RIE), chemical oxide removal (COR) or a combinations thereof.

In the multi-stack semiconductor device 10 shown in FIGS. 1A and 1B, the lower field-effect transistor 110 may be an n-type field-effect transistor (NFET) in which the $1^{st}$ and $2^{nd}$ source/drain regions 113 and 114 may be formed of silicon (Si) and doped with n-type impurities such as phosphorous and/or arsenic. In contrast, the upper field-effect transistor 120 may be a p-type field-effect transistor (PFET) in which the $3^{rd}$ and $4^{th}$ source/drain regions 123 and 124 may be formed of silicon (Si) or silicon-germanium (SiGe) doped with p-type impurities such as boron and/or gallium. However, the disclosure is not limited thereto. In other embodiments, the lower and upper field-effect transistors 110 and 120 may be the PFET and the NFET, respectively, or may each be the PFET or the NFET.

In order to power the lower and upper field-effect transistors 110 and 120 and/or connect these two field-effect transistors to one or more other circuit elements (not shown), the multi-stack semiconductor device 10 may include $1^{st}$ to $4^{th}$ contact structures 115, 116, 125 and 126 extended down in the D3 direction and connected to the $1^{st}$ to $4^{th}$ source/drain regions 113, 114, 123 and 124 of the two field-effect transistors 110 and 120, respectively. The $1^{st}$ to $4^{th}$ contact structures 115, 116, 125 and 126 connect the two field-effect transistors 110 and 120 to a power source and/or other circuit elements through one or more back-end-of-line (BEOL) elements such as metal patterns (not shown) or one or more middle-of-line (MOL) elements such as via structures (not shown) formed above the multi-stack semiconductor device 10. Each of the $1^{st}$ to $4^{th}$ contact structure 115, 116, 125 and 126 may be formed of an electrically conducting material, for example a conductor metal material such as cobalt (Co), tungsten (W), ruthenium (Ru), or a combination thereof, not being limited thereto. These contact structures may be formed through direct and/or wet etching such as RIE and deposition such as CVD, PECVD, not being limited thereto.

According to an embodiment, the multi-stack semiconductor device 10 may form an inverter circuit of which a circuit schematic is illustrated in FIG. 1D. The inverter circuit shown in FIG. 1C includes a PFET and an NFET connected in series. For connections of the inverter circuit to a power source and another circuit element, source nodes of the PFET and the NFET are connected to a positive voltage source Vdd and a negative voltage source Vss, respectively, and drain nodes of the PFET and the NFET are merged out to be connected to another circuit element based on a common gate input signal. Here, the PFET and the NFET may be formed by the upper-stack field-effect transistor 110 and the lower-stack field-effect transistor 120, respectively, shown in FIGS. 1A to 1C.

Thus, the $1^{st}$ source/drain region 113 of the lower field-effect transistor 110 may be connected to the negative voltage source Vss through the $1^{st}$ contact structure 115, and the $3^{rd}$ source/drain region 123 of the upper field-effect transistor 120 may be connected to the positive voltage source Vdd through the $3^{rd}$ contact structure 125. Further the $2^{nd}$ source/drain region 114 of the lower field-effect transistor 110 and the $4^{th}$ source/drain region 124 may be merged to each other by connecting the $2^{nd}$ contact structure 116 to the $4^{th}$ contact structure 126.

Here, it is noted that the $3^{rd}$ and $4^{th}$ source/drain regions 123 and 124 of the upper field-effect transistor 120 vertically overlap the $1^{st}$ and $2^{nd}$ source/drain regions 113 and 114 of the lower field-effect transistor 110, respectively. Thus, the $1^{st}$ and $2^{nd}$ contact structures 115 and 116 extended straight down from at least one BEOL or MOL element (not shown) may need to be bent to make respective lateral contacts to side portions or surfaces of the $1^{st}$ and $2^{nd}$ source/drain regions 113 and 114 of the lower field-effect transistor 110. Further, the $4^{th}$ contact structure 126 also makes a lateral contact to a side portion or surface of the $4^{th}$ source/drain region 124 to be connected to the $2^{nd}$ contact structure 116. Only the $3^{rd}$ contact structure 125 may be extended straight down from at least one BEOL or MOL element (not shown) to directly land on a top portion or surface of the $3^{rd}$ source/drain region 123 without being bent.

However, it is very difficult to realize the aforementioned lateral connections to source/drain regions of a field-effect transistor at a lower stack using bent-shaped contact structures. Further, the lateral connections using the bent-shaped contact structures may increase an entire size of a multi-stack semiconductor device.

The foregoing overlapping source/drain structures and the bent contact structures in a multi-stack semiconductor device are caused by channel structures and source/drain regions having the same sizes at least in a D1 direction (e.g., channel widths of nanosheet layers in FIG. 1B) both in the lower and upper stacks of the multi-stack semiconductor device. Thus, another embodiment of a multi-stack semiconductor device is provided herebelow, which includes channel structures and source/drain regions having different sizes in lower and upper stacks of the multi-stack semiconductor device.

Figure 2A:
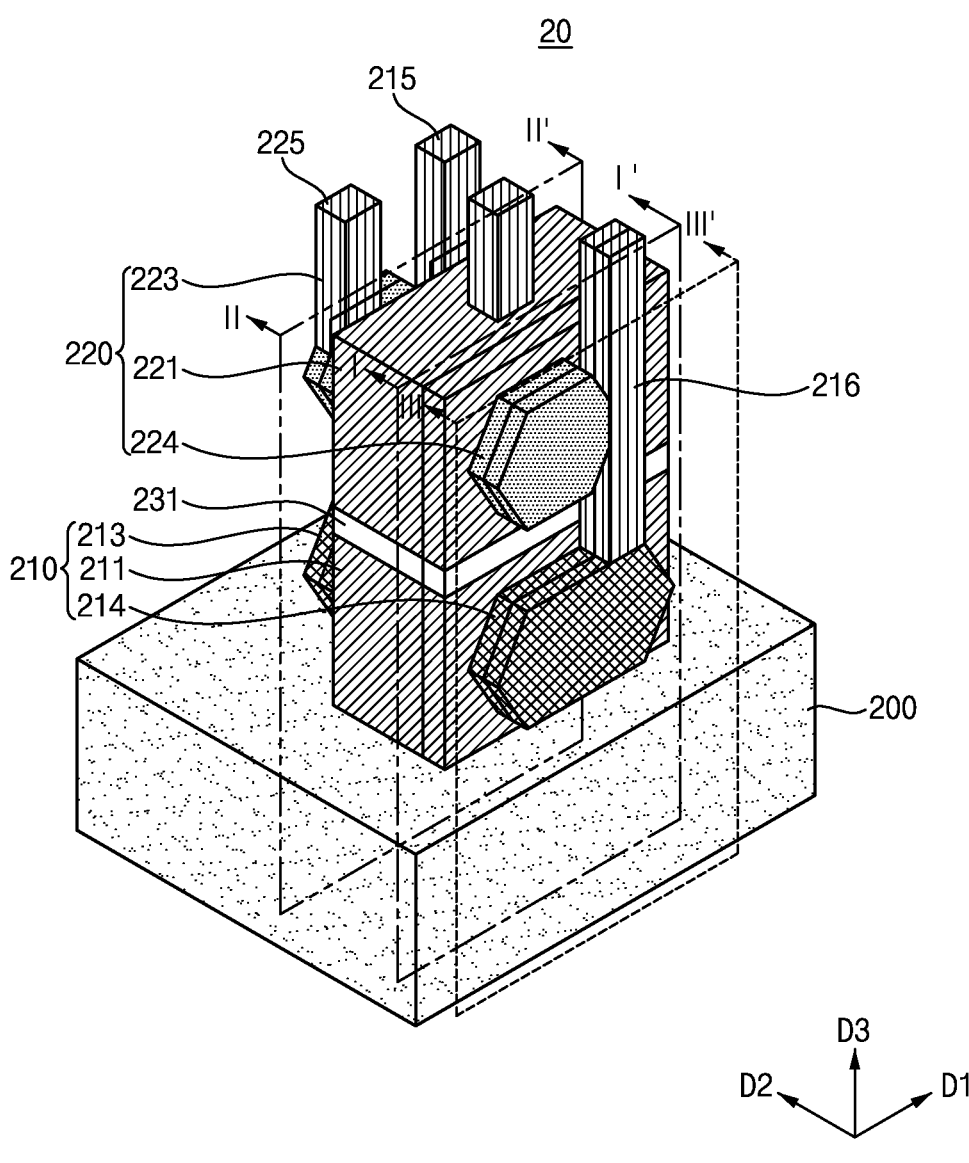
FIG. 2A illustrates a perspective view of a multi-stack semiconductor device including lower and upper field-effect transistors, according to another embodiment.
Figure 2B:
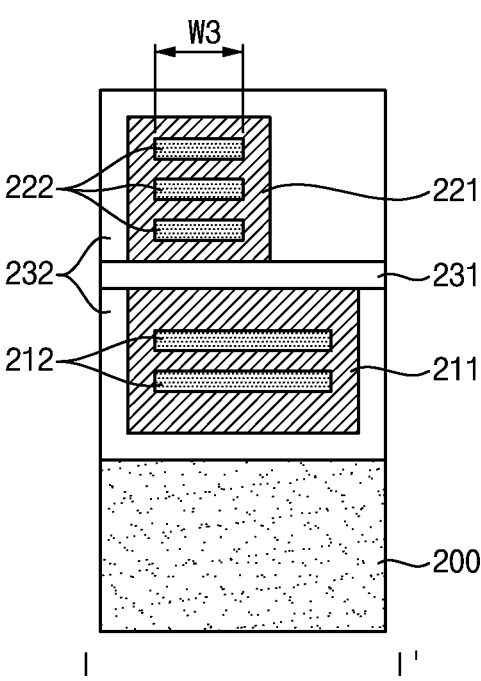
FIG. 2B illustrates a cross-sectional view of the multi-stack semiconductor device of FIG. 2A taken along a line I-I' shown in FIG. 2A.
Figure 2C:
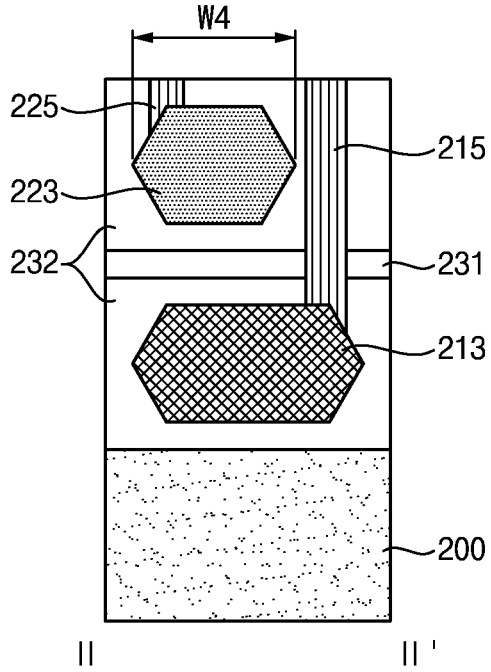
FIG. 2C illustrates a cross-sectional view of the multi-stack semiconductor device of FIG. 2A taken along a line II-II' shown in FIG. 2A.
Figure 2D:
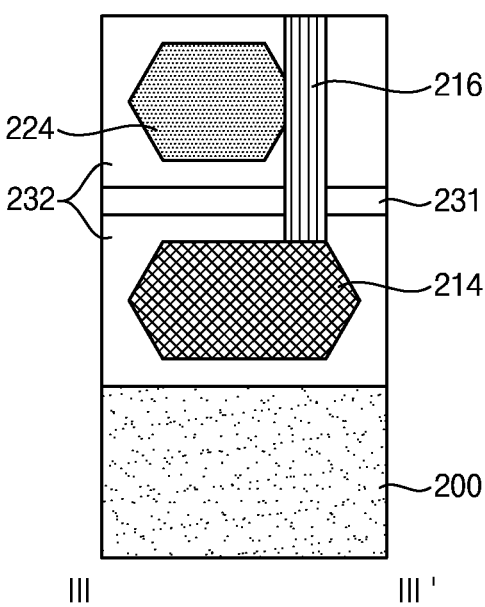
FIG. 2D illustrates a cross-sectional view of the multi-stack semiconductor device of FIG. 2A taken along a line III-III' shown in FIG. 2A, according to an embodiment.

FIG. 2A illustrates a perspective view of a multi-stack semiconductor device including lower and upper field-effect transistors, according to another embodiment. FIG. 2B illustrates a cross-sectional view of the multi-stack semiconductor device of FIG. 2A taken along a plane I-I' shown in FIG. 2A, according to an embodiment. FIG. 2C illustrates a cross-sectional view of the multi-stack semiconductor device of FIG. 2A taken along a plane II-II' shown in FIG. 2A, according to an embodiment. FIG. 2D illustrates a cross-sectional view of the multi-stack semiconductor device of FIG. 2A taken along a plane III-III' shown in FIG. 2A, according to an embodiment.

According to FIGS. 2A to 2D, a multi-stack semiconductor device 20 may include a substrate 200, a lower field-effect transistor 210 formed on the substrate 200, and an upper field-effect transistor 220 stacked above the lower nanosheet transistor 210 on the substrate 200. Like the substrate 100 shown in FIGS. 1A to 1C, the substrate 200 may also be a bulk substrate of a semiconductor material such as Si, or an SOI substrate, not being limited thereto.

According to an embodiment, the multi-stack semiconductor device 20 may also form an inverter circuit of which a circuit schematic is shown in FIG. 1D as described above. Similarly, the lower and upper field-effect transistors 210 and 220 may be an NFET and a PFET, respectively, in the present embodiment.

Similar to the lower field-effect transistor 110 shown in FIGS. 1A and 1B, the lower field-effect transistor 210 formed at a lower stack on the substrate 200 may include a lower gate structure 211 surrounding a lower channel structure 212 formed of a plurality nanosheet layers stacked in the D3 directions and extended in the D1 and D2 directions. At both ends of the lower channel structure 212 in the D2 direction, a $1^{st}$ source/drain region 213 and a $2^{nd}$ source/drain region 214 may be formed respectively to be connected through the lower channel structure 212 that functions as a current flow channel of the lower field-effect transistor 210. Similarly, the upper field-effect transistor 220 formed at an upper stack above the lower field-effect transistor 210 may include an upper gate structure 221 surrounding an upper channel structure 222 formed of a plurality nanosheet layers stacked in the D3 direction and extended in the D1 and D2 directions. At both ends of the upper channel structure 222 in the D2 direction, a $3^{rd}$ source/drain region 223 and a $4^{th}$ source/drain region 224 may be formed respectively to be connected through the upper channel structure 222 that functions as a current flow channel of the upper field-effect transistor 220.

Materials and methods forming the channel structures 212 and 222, the gate structures 211 and 221, and the $1^{st}$ to $4^{th}$ source/drain regions 213, 214, 223 and 224 may be the same as those forming the channel structures 112 and 122, the gate structures 111 and 121, and the $1^{st}$ to $4^{th}$ source/drain regions 113, 114, 123 and 124, respectively, in the multi-stack semiconductor device 10, and thus, duplicate descriptions are omitted herein.

However, the dimensions of the upper channel structure 222 and the $3^{rd}$ and $4^{th}$ source/drain regions 223 and 224 of the upper field-effect transistor 220 according to the present embodiment shown in FIGS. 2A and 2B is different from the upper channel structure 122 and the $3^{rd}$ and $4^{th}$ source/drain regions 123 and 124 of the upper field-effect transistor 120 shown in FIGS. 1A and 1B.

According to embodiments, each nanosheet layer forming the lower channel structure 212 of the lower field-effect transistor 210 may have the same channel width W1 as each nanosheet layer forming the lower channel structure 112 of the lower field-effect transistor 110. However, each nanosheet layer forming the upper channel structure 222 of the upper field-effect transistor 120 may have a channel width W3 which is smaller than the channel width W1 of the lower channel structure 212 of the lower field-effect transistor 210. Accordingly, a width W4 of each of the $3^{rd}$ and $4^{th}$ source/drain regions 223 and 224 that are grown from the upper channel structure 222 of the upper field-effect transistor 220 may be smaller than the width W2 of each of the $1^{st}$ and $2^{nd}$ source/drain regions 213 and 214 that are grown from the lower channel structure 212 of the lower field-effect transistor 210.

The above adjustment of the widths of the upper channel structure 222 and the $3^{rd}$ and $4^{th}$ source/drain regions 223 and 224 may enable the multi-stack semiconductor device 20 to have a reduced number of contact structures which connect the lower and upper field-effect transistors 210 and 220 to one or more voltage sources and other circuit elements, according to an embodiment. While the multi-stack semiconductor device 10 of the previous embodiment shown in FIGS. 1A and 1B requires the four contact structures 115, 116, 125 and 126 for the connections of the lower and upper field-effect transistors 110 and 120, the multi-stack semiconductor device 20 of the present embodiment shown may require only three contact structures in a reduced space as described below.

FIGS. 2A to 2D shows that the multi-stack semiconductor device 20 includes only three contact structures, that is, $1^{st}$ to $3^{rd}$ contact structures 215, 216 and 225. Materials and methods used forming these contact structures may be the same as or similar to the $1^{st}$ to $4^{th}$ contact structures 115, 116, 125 and 126 of the multi-stack semiconductor device 10 in the previous embodiment, and thus, duplicate descriptions are omitted herein.

Like the $3^{rd}$ contact structure 125, the $3^{rd}$ contact structure 225 of the multi-stack semiconductor device 20 may also be extended straight down from one or more BEOL or MOL elements, and connected to a top portion or surface of the $3^{rd}$ source/drain region 223 to provide a positive voltage.

However, unlike the $1^{st}$ contact structure 115 which is bent for lateral connection to the side portion or surface of the $1^{st}$ source/drain region 113 of the lower field-effect transistor 110, the $1^{st}$ contact structure 215 in the present embodiment may be able to make a straight landing on a top portion or surface of the $1^{st}$ source/drain region 213 of the lower field-effect transistor 210 as shown in FIG. 2C. That is, the $1^{st}$ contact structure 215 may not need to be bent for connection to the $1^{st}$ source/drain region 213. This simplified connection structure of the $1^{st}$ contact structure 215 may be enabled by the reduced width W3 of the upper channel structure 222 and the reduced width W4 of the $3^{rd}$ source/drain region 223 of the upper field-effect transistor 220 formed above the lower channel structure 212 and the $1^{st}$ source/drain region 213 of the lower field-effect transistor 210, respectively. Due to this connection structure, the $1^{st}$ contact structure 215 may be extended straight down from one or more BEOL or MOL elements through a space provided at a side of the $3^{rd}$ source/drain region 223.

Moreover, the reduced width W3 of the upper channel structure 222 and the reduced width W4 of the $4^{th}$ source/drain region 224 may enable the $2^{nd}$ source/drain region 214 to be merged with the $4^{th}$ source/drain region 224 using the single contact structure 216 to form an output node of the inverter circuit formed by the multi-stack semiconductor device 20. For example, FIGS. 2A and 2D show that there may be provided a space at a side of the $4^{th}$ source/drain region 224 to be used by the $2^{nd}$ contact structure 216 to make a straight landing on a top portion or surface of the $2^{nd}$ source/drain region 214, and further, make a contact on at least a side portion or surface of the $4^{th}$ source/drain region 224 in the multi-stack semiconductor device 20. Thus, one single contact structure 216 may be able to merge the two source/drain regions 214 and 224 in the multi-stack semiconductor device 20, while the multi-stack semiconductor device 10 requires two contact structures 116 and 126 to merge the two source/drain regions 114 and 124.

Thus, while the multi-stack semiconductor device 10 in the previous embodiment requires two separate contact structures 116 and 126 to merge the $2^{nd}$ and $4^{th}$ source/drain regions 114 and 124, the multi-stack semiconductor device 20 in the present embodiment may need only one contact structure, that is, the $2^{nd}$ contact structure 216 to merge the $2^{nd}$ and $4^{th}$ source/drain regions 214 and 224 to implement an inverter circuit from the multi-stack semiconductor device 20.

In the meantime, while the upper field-effect transistor 220 has the smaller widths of the channel structure and the source/drain regions than the lower field-effect transistor 210, the upper field-effect transistor 220 may have more nanosheet layers forming the channel structure than the lower field-effect transistor 210 in the multi-stack semiconductor device 20, according to an embodiment. For example, FIGS. 2A to 2D shows that the upper channel structure 222 of the upper field-effect transistor 220 may be formed of three nanosheet layers, and the lower channel structure 212 of the lower field-effect transistor 210 may be formed of two nanosheet layers. Due to this adjustment of the number of nanosheet layers across the lower and upper stacks, the channel structures 212 and 222 may have the same current flowing capacity in a unit time. However, the number of nanosheet layers forming the channel structures 212 and 222 may not be limited to two and three, respectively. According to embodiments, the number of nanosheet layers forming the channel structures 212 and 222 may be more than two and three, respectively, as long as the upper channel structure 222 has a smaller channel width than the lower channel structure 212 and the same amount of current can flow through the channel structures 212 and 222 in a unit time.

Accordingly, the multi-stack semiconductor device 20 having a stepped multi-stack structure in the present embodiment may provide an enhanced device density by reducing the widths of the channel structure and the source/drain regions of an upper-stack field-effect transistor.

Figure 3A:
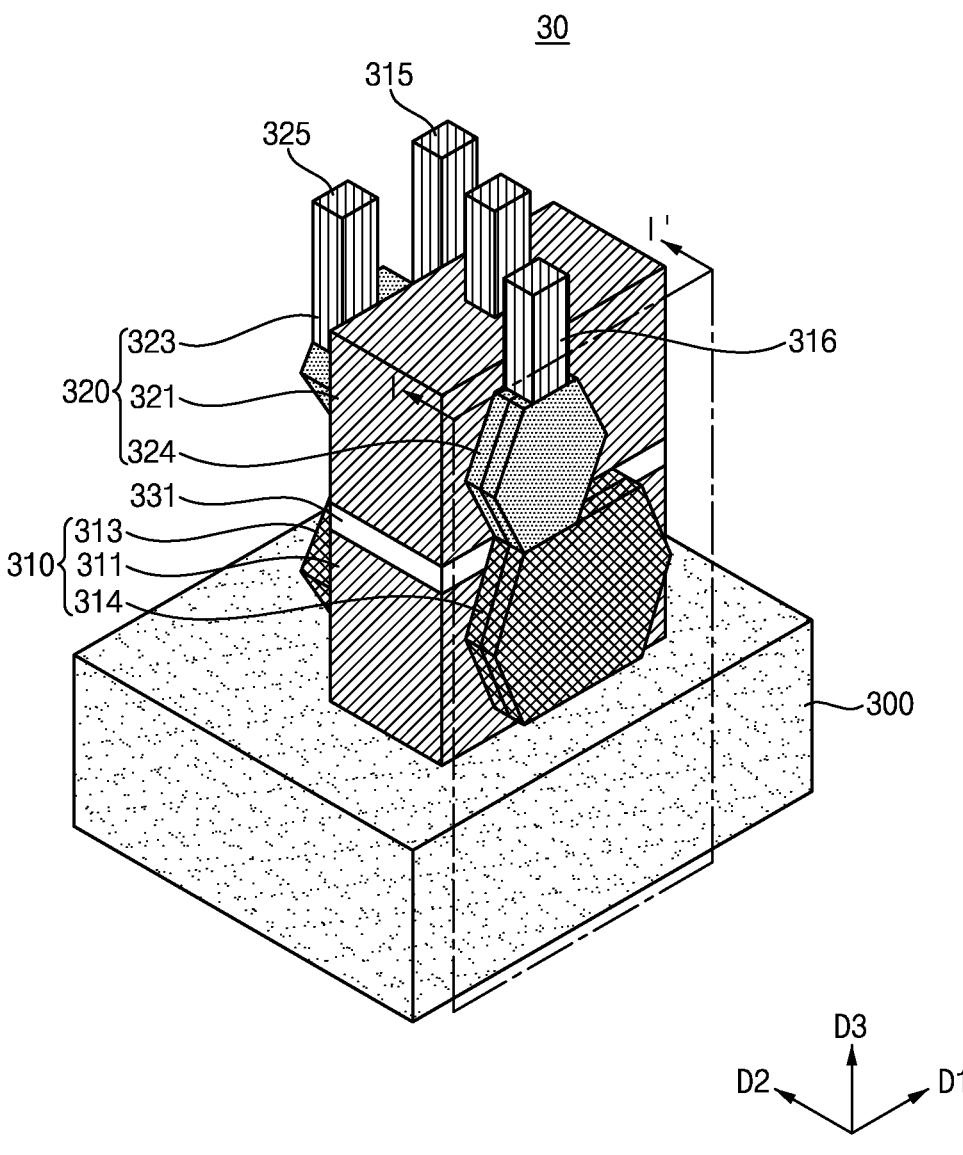
FIG. 3A illustrates a perspective view of a multi-stack semiconductor device including lower and upper field-effect transistors, according to still another embodiment.
Figure 3B:
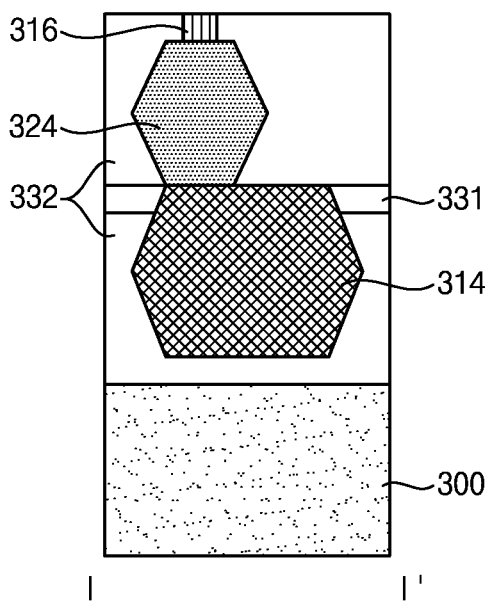
FIG. 3B illustrates a cross-sectional view of the multi-stack semiconductor device of FIG. 3A taken along a line I-I' shown in FIG. 3A, according to an embodiment.

FIG. 3A illustrates a perspective view of a multi-stack semiconductor device including lower and upper field-effect transistors, according to still another embodiment. FIG. 3B illustrates a cross-sectional view of the multi-stack semiconductor device of FIG. 3A taken along a plane I-I' shown in FIG. 3A, according to an embodiment.

Referring to FIGS. 3A and 3B, a multi-stack semiconductor device 30 may have the same or similar stepped multi-stack structure as the multi-stack semiconductor device 20. Thus, materials and methods forming a substrate 300, a lower upper field-effect transistors 310 and an upper lower field-effect transistor 320 in the multi-stack semiconductor device 30 may be the same as or similar to those of the multi-stack semiconductor device 20. Thus, duplicate descriptions are not provided herein for gate structures 311 and 321, channel structures 312 and 322, $1^{st}$ to $4^{th}$ source/drain regions 313, 314, 323 and 324, and $1^{st}$ and $3^{rd}$ contact structures 315 and 325.

For example, the $1^{st}$ and $3^{rd}$ contact structures 315 and 325 respectively connected to the $1^{st}$ and $3^{rd}$ source/drain regions 313 and 323 may have the same connection structure as the contact structures 215 and 225 respectively connected to the $1^{st}$ and $3^{rd}$ source/drain regions 213 and 223 in the multi-stack semiconductor device 20.

However, the $2^{nd}$ source/drain region 314 of the lower field-effect transistor 310 and the $4^{th}$ source/drain region 324 of the upper field-effect transistor 320 may be merged in a different manner in the multi-stack semiconductor device 30 of the present embodiment.

FIGS. 3A and 3B show that the two source/drain regions 314 and 324 are directly merged, thereby forming a PN junction, equivalent to a diode, therebetween, according to an embodiment. In other words, the $2^{nd}$ source/drain region 314 and the $4^{th}$ source/drain regions 324 are directly merged in the D3 direction without using a contact structure like the $2^{nd}$ contact structure 216 provided in the multi-stack semiconductor device 20 of the previous embodiment. For example, a bottom portion or surface of the $4^{th}$ source/drain region 324 and a top portion or surface of the $2^{nd}$ source/drain region 314 vertically facing the bottom portion or surface of the $4^{th}$ source/drain region may be directly connected to each other.

Since the upper and lower field-effect transistors 320 and 310 are a PFET and an NFET, respectively, in an inverter circuit, the PN junction formed therein may still be able to flow a current from the $4^{th}$ source/drain region 324 to the $2^{nd}$ source/drain region 314 only if a voltage greater than or equal to an operation voltage of a diode (e.g., 0.7 V) is applied to the PN junction to overcome a barrier formed by the PN junction.

In order to directly merge the two source/drain regions 324 and 314, at least one of the two source/drain regions 324 and 314 may be epitaxially overgrown from the respective channel structures 322 and 312 to have a thicker source/drain profile than in the two source/drain regions 224 and 214 in FIGS. 2A to 2D, according to an embodiment. For example, the $2^{nd}$ source/drain region 314 may be epitaxially overgrown to contact the $4^{th}$ source/drain region 324 as shown in FIGS. 3A and 3B. However, the $4^{th}$ source/drain region 324 may also be epitaxially overgrown to contact the $2^{nd}$ source/drain region 314, according to an embodiment.

As the two source/drain regions 324 and 314 are merged in the above manner, a $2^{nd}$ contact structure 316 connecting the merged source/drain regions 324 and 314 to another circuit element may simply land on a top portion or surface of the $4^{th}$ source/drain region 324. That is, this single $2^{nd}$ contact structure 316 may be simply extended straight down from a BEOL or MOL element to directly land on the top portion or surface of the $4^{th}$ source/drain region 324. The $2^{nd}$ contact structure 316 may output an output signal of the multi-stack semiconductor device, which may be an inverter circuit, to another circuit element.

Due to the above direct source/drain region merging structure, a manufacturing process of the multi-stack semiconductor device 30 may become more simplified at least in forming contact structures compared to that of the multi-stack semiconductor device 20 in which the corresponding $2^{nd}$ contact structure 216 contacts the side portion or surface of the $4^{th}$ source/drain region 224 before it is extended down to the top portion or surface of the $2^{nd}$ source/drain regions 214 as shown in FIGS. 2A and 2D.

While multi-stack semiconductor devices in the present and previous embodiments form an inverter circuit having merged source/drain regions as an output node of the inverter circuit, the merged source/drain regions between upper and lower stack field-effect transistors are employed in various different transistor circuits other than the inverter circuit. When such different transistor circuits are formed using a multi-stack semiconductor device having a direct source/drain region merging structure as shown in FIGS. 3A and 3B, the $2^{nd}$ contact structure 316 may be connected to another voltage source supplying a voltage greater than or equal to a diode operation voltage, according to an embodiment.

The above direct merging structure in a multi-stack semiconductor device may be implemented in different manners as described below in other embodiments.

Figure 4A:
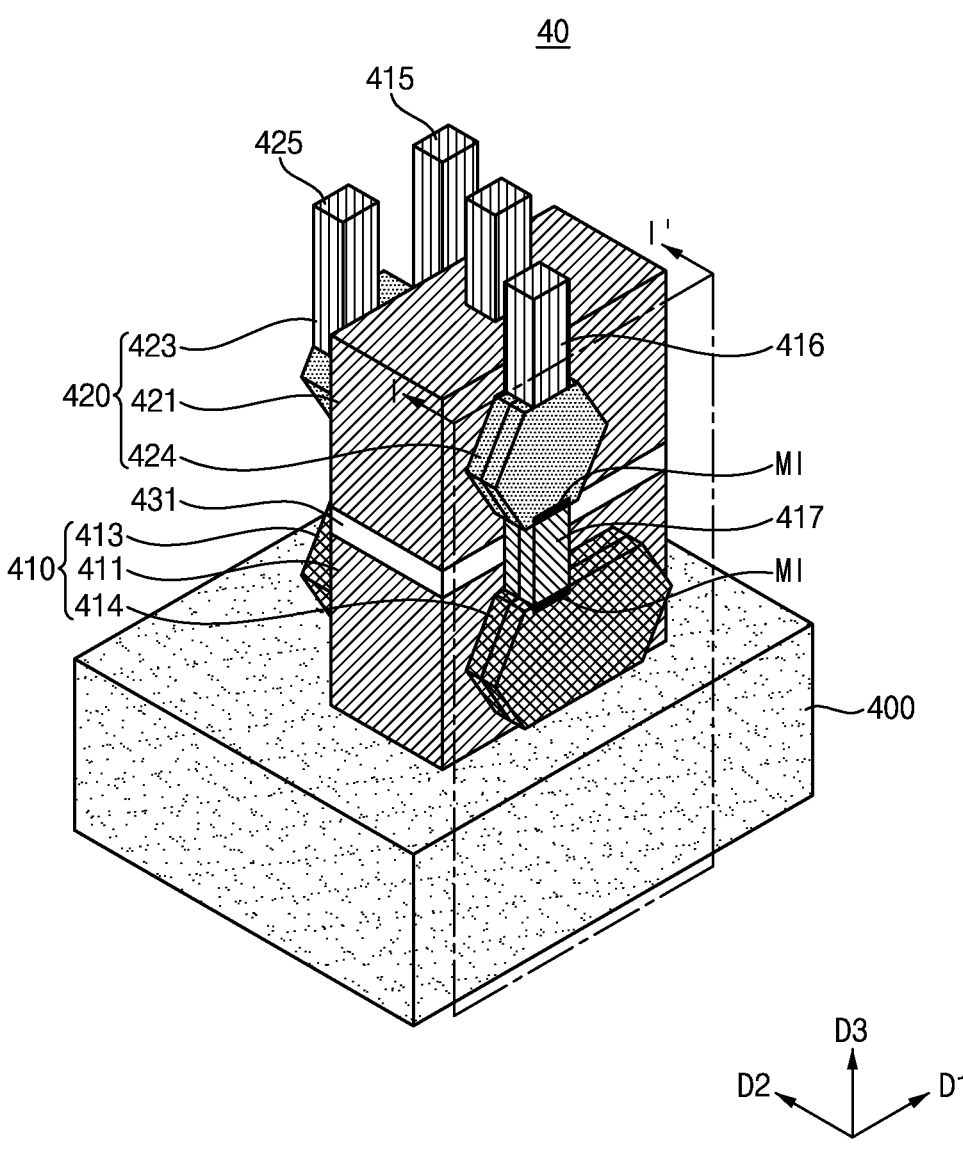
FIG. 4A illustrates a perspective view of a multi-stack semiconductor device including lower and upper field-effect transistors, according to still another embodiment.
Figure 4B:
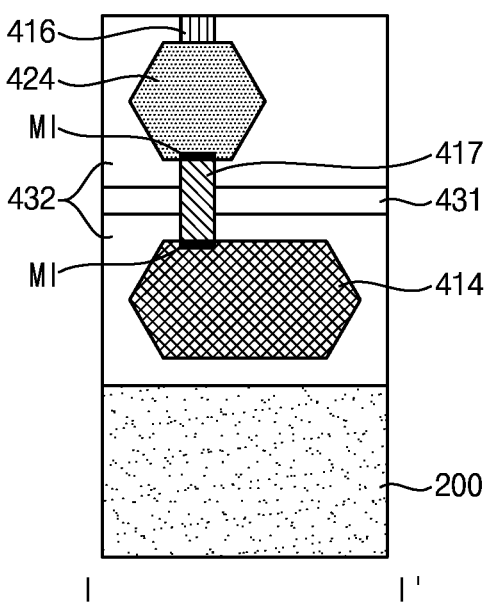
FIG. 4B illustrates a cross-sectional view of the multi-stack semiconductor device of FIG. 4A taken along a line I-I' shown in FIG. 4A, according to an embodiment.

FIG. 4A illustrates a perspective view of a multi-stack semiconductor device including lower and upper field-effect transistors, according to still another embodiment. FIG. 4B illustrates a cross-sectional view of the multi-stack semiconductor device of FIG. 4A taken along a plane I-I' shown in FIG. 4A, according to an embodiment.

Referring to FIGS. 4A and 4B, a multi-stack semiconductor device 40 may have the same or similar stepped multi-stack structure as the multi-stack semiconductor device 30. Thus, materials and methods forming a substrate 400, a lower upper field-effect transistors 410 and an upper lower field-effect transistor 420 in the multi-stack semiconductor device 40 may be the same as or similar to those of the multi-stack semiconductor device 30. Thus, duplicate descriptions are not provided herein for gate structures 411 and 421, channel structures 412 and 422, $1^{st}$ to $4^{th}$ source/drain regions 413, 414, 423 and 424, and $1^{st}$ to $3^{rd}$ contact structures 415, 416 and 425.

In the multi-stack semiconductor device 30 shown in FIGS. 3A and 3B, the $4^{th}$ and $2^{nd}$ source/drain regions 324 and 314 are directly merged without an external contact or connection structure between the lower and upper field-effect transistors 310 and 320. In contrast, the multi-stack semiconductor device 40 in the present embodiment provides a supplemental connection structure 417 that directly merges the $4^{th}$ and $2^{nd}$ source/drain regions 424 and 414 in the D3 direction. For example, a bottom portion or surface of the $4^{th}$ source/drain region 324 and a top portion or surface of the $2^{nd}$ source/drain region 314 vertically facing each other may be directly connected to each other through the supplemental connection structure 417.

In the present embodiment, the two source/drain regions 424 and 414 are directly merged like the two source/drain regions 324 and 314 in the multi-stack semiconductor device 30, that is, without using an external contact or connection structure such as the $2^{nd}$ contact structure 216 in the multi-stack semiconductor device 20 as shown in FIGS. 2A and 2D. Thus, in the multi-stack semiconductor device 40 of the present embodiment, the $2^{nd}$ contact structure 416 may be simply extended straight down from a BEOL or MOL element to directly land on a top portion or surface of the $4^{th}$ source/drain region 424. The $2^{nd}$ contact structure 416 may connect the merged source/drain regions 424 and 414, which may be an output node of the multi-stack semiconductor device 40, to another circuit element.

According to embodiments, the supplemental connection structure 417 may be formed of a metal, a metal compound or Si. The supplemental connection structure 417 may be formed though a number of manufacturing steps including photolithography, deposition and/or subtractive etching, not being limited thereto, during and after epitaxial growth of the $2^{nd}$ and $4^{th}$ source/drain regions 414 and 424. Further, the bottom portion or surface of the $4^{th}$ source/drain region 424 and the top portion or surface of the $2^{nd}$ source/drain region 414 facing each other may have a metal ion implantation structure MI to enable an ohmic or quasi-ohmic contact between the two source/drain regions 424 and 414, according to an embodiment. The metal ion implantation may be performed using an ion beam implantation technique or a plasma implantation technique, not being limited thereto, according to embodiments. Preferably but not necessarily, the supplemental connection structure 417 may by formed of a metal or a metal compound which may be easier to form an ohmic contact than silicon (Si).

With this supplemental connection structure 417 between the two source/drain regions 424 and 414, the multi-stack semiconductor device 40 in the present embodiment may not need to meet the requirement for overcoming the PN junction barrier formed between the two source/drain regions 324 and 314 in the previous embodiment shown in FIGS. 3A and 3B, that is, a requirement of applying a voltage greater than or equal to a diode operation voltage to the PN junction formed between the two source/drain regions 324 and 314 in the multi-stack semiconductor device 30.

It is noted that the multi-stack semiconductor devices 30 and 40 including the direct source/drain region merging structure as shown in FIGS. 3A, 3B, 4A and 4B have the stepped multi-stack structure like the multi-stack semiconductor device 20 shown in FIGS. 2A to 2D. However, when the direct source/drain region merging structure is used, a multi-stack semiconductor device may have the same multi-stack structure as the multi-stack semiconductor device 10 shown in FIGS. 1A to 1C, as described below.

Figure 5A:
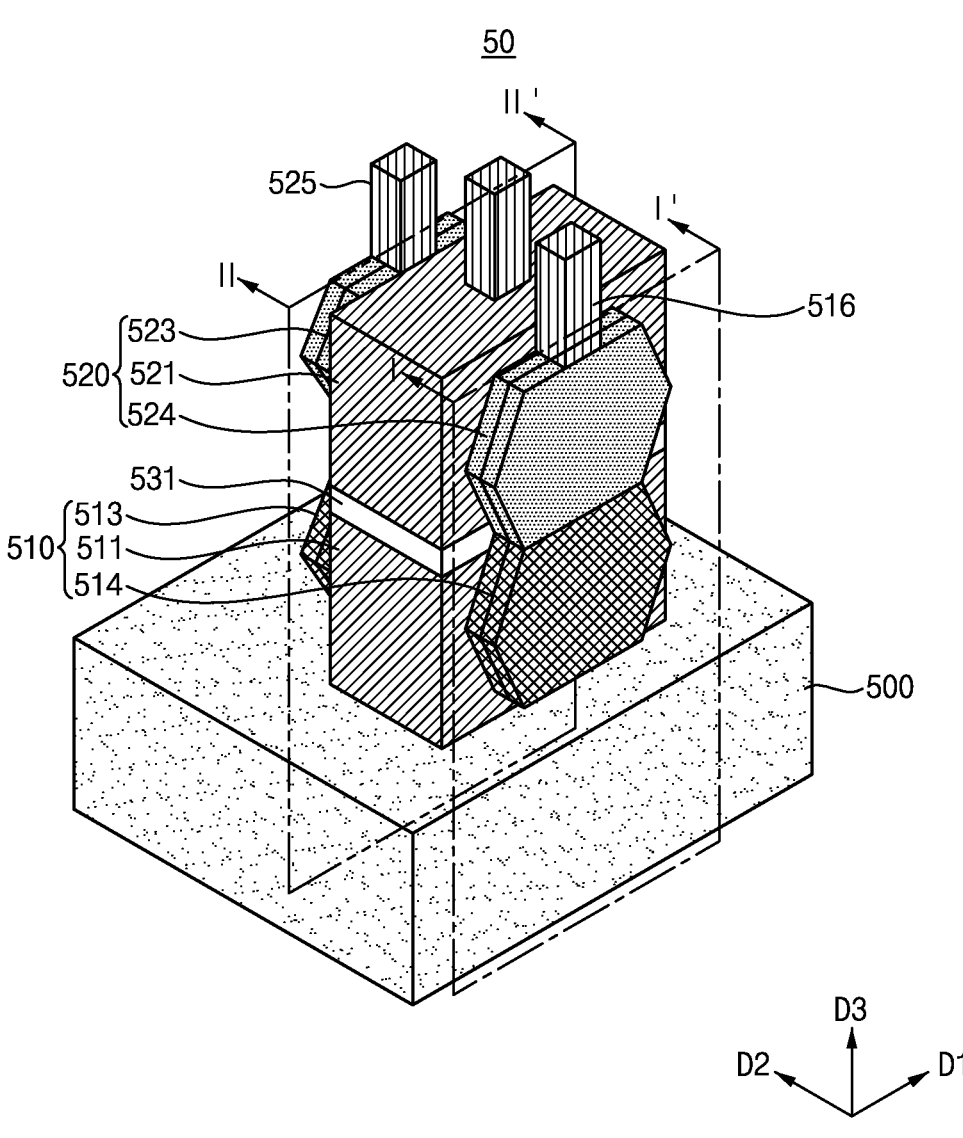
FIG. 5A illustrates a perspective view of a multi-stack semiconductor device including lower and upper field-effect transistors, according to still another embodiment.
Figure 5B:
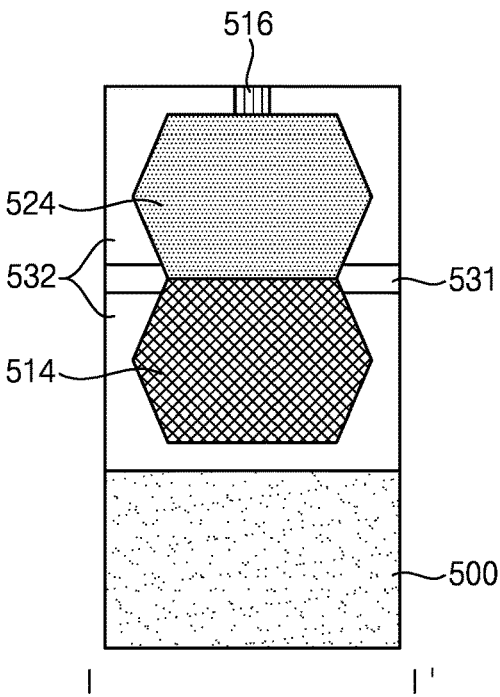
FIG. 5B illustrates a cross-sectional view of the multi-stack semiconductor device of FIG. 5A taken along a line I-I' shown in FIG. 5A, according to an embodiment.
Figure 5C:
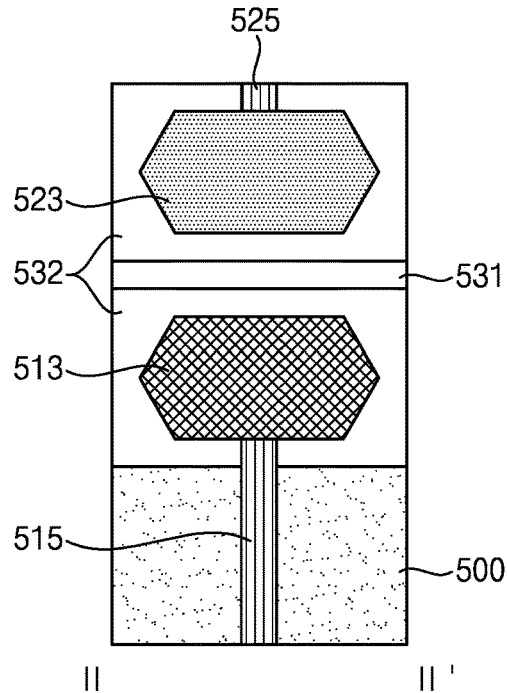
FIG. 5C illustrates a cross-sectional view of the multi-stack semiconductor device of FIG. 5A taken along a line II-II' shown in FIG. 5A, according to an embodiment.

FIG. 5A illustrates a perspective view of a multi-stack semiconductor device including lower and upper field-effect transistors, according to still another embodiment. FIG. 5B illustrates a cross-sectional view of the multi-stack semiconductor device of FIG. 5A taken along a line I-I' shown in FIG. 5A, according to an embodiment. FIG. 5C illustrates a cross-sectional view of the multi-stack semiconductor device of FIG. 5A taken along a line II-II' shown in FIG. 5A, according to an embodiment.

Referring to FIGS. 5A to 5C, a multi-stack semiconductor device 50 may have the same or similar multi-stack structure as the multi-stack semiconductor device 10 shown in FIGS. 1A to 1C. Thus, materials and methods forming a substrate 500, a lower upper field-effect transistors 510 and an upper lower field-effect transistor 520 in the multi-stack semiconductor device 50 may be the same as or similar to those of the multi-stack semiconductor device 10. Thus, duplicate descriptions are not provided herein for gate structures 511 and 521, channel structures 512 and 522, and $1^{st}$ to $4^{th}$ source/drain regions 513, 514, 523 and 524.

However, the multi-stack semiconductor device 50 is characterized by the direct source/drain region merging structure used in the multi-stack semiconductor device 30 shown in FIGS. 3A and 3B, and a back side power distribution network (BSPDN) structure.

As shown in FIGS. 5A to 5C, in the multi-stack semiconductor device 50, the $2^{nd}$ and $4^{th}$ source/drain regions 514 and 524 are directly merged to each other to form a PN junction. Further, a single $2^{nd}$ contact structure 516 may be connected to a top portion or surface of the $4^{th}$ source/drain region for connection of the merged source/drain regions 514 and 524 to another circuit element in the same manner as the $2^{nd}$ contact structures 316 and 416 in the multi-stack semiconductor devices 30 and 40. Moreover, in order to avoid a bent-shaped contact structure such as the $1^{st}$ contact structure 115 shown in FIG. 1A, the $1^{st}$ contact structure 515 may be formed below the lower field-effect transistor 510, for example, inside the substrate 500 as a BSPDN structure and connected to a bottom portion or surface of the $1^{st}$ source/drain region 513 to supply a negative voltage thereto. The $1^{st}$ contact structure 515 may be formed through a number of manufacturing steps including photolithography, deposition and/or subtractive etching, not being limited thereto. Since the $1^{st}$ contact structure 515 is formed as a BSPDN structure, the multi-stack semiconductor device 50 may be able to increase not only device density but also utility of the substrate 500.

In the multi-stack semiconductor device 50, the $3^{rd}$ contact structure 525 may be connected to a top portion or surface of the $3^{rd}$ source/drain region 523 similarly to the $3^{rd}$ contact structure 125 in the multi-stack semiconductor device 10 so that a positive voltage can be supplied to the $3^{rd}$ source/drain region 523 through the $3^{rd}$ contact structure 525.

It is noted that the multi-stack semiconductor device 50 may be manufactured in a more simplified manner without the complicated contact structures as in the multi-stack semiconductor device 10, and further, without forming the stepped multi-stack structure as in the multi-stack semiconductor devices 30 and 40.

As described above, the direct source/drain region merging structure may use the single $2^{nd}$ contact structure 516 connected to the top portion or surface of the $4^{th}$ source/drain region to form an output node of the multi-stack semiconductor device 50. The $2^{nd}$ contact structure 516 may be extended straight down from one or more BEOL or MOL elements formed above the upper field-effect transistor 520 to be connected to the top portion or surface of the $3^{rd}$ source/drain region 523. However, like the $1^{st}$ contact structure 515, the $2^{nd}$ contact structure 516 may also be extended from below the lower field-effect transistor 510, for example, inside the substrate 500 to be connected to a bottom portion or surface of the $2^{nd}$ source/drain region 514 as described below.

Figure 6A:
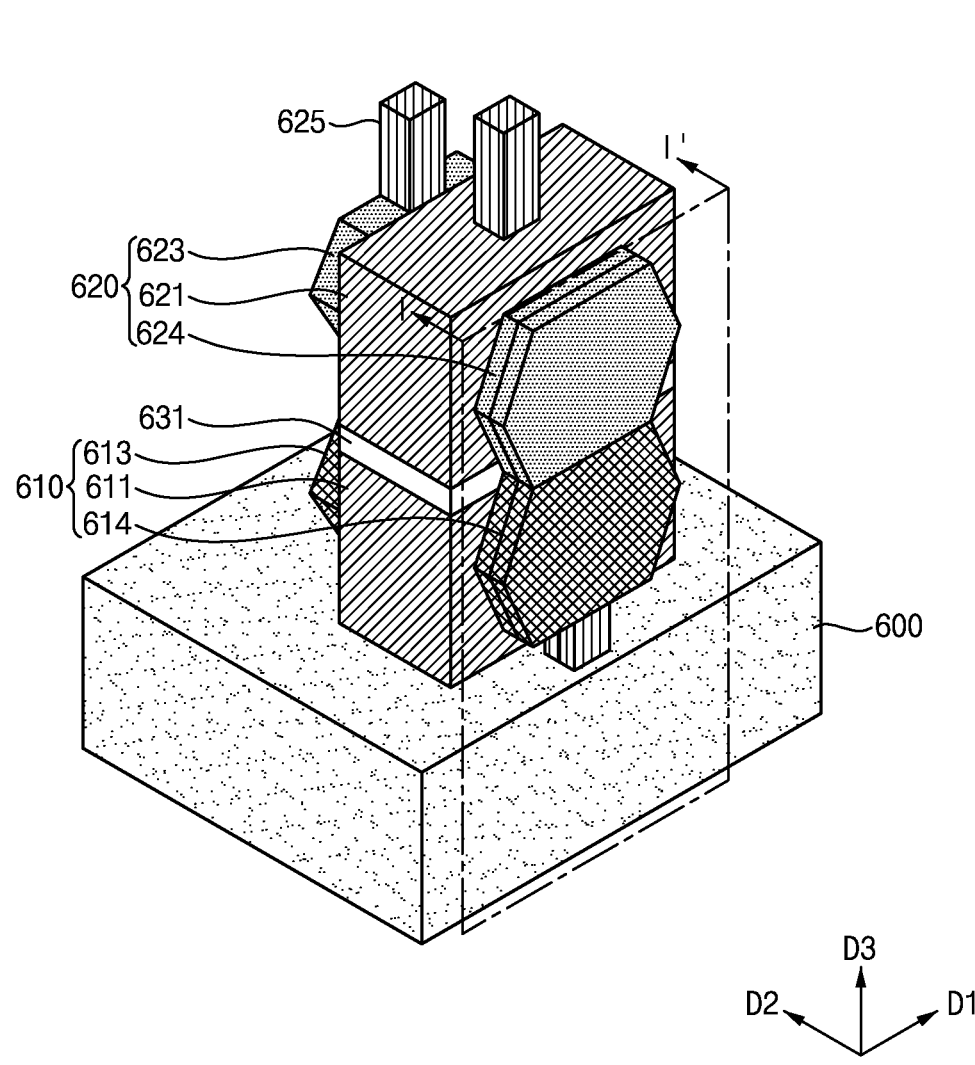
FIG. 6A illustrates a perspective view of a variant of the multi-stack semiconductor device shown in FIGS. 5A and 5B.

FIG. 6A illustrates a perspective view of a variant of the multi-stack semiconductor device shown in FIGS. 5A to 5C, and FIG. 6B illustrates a cross-sectional view of the multi-stack semiconductor device of FIG. 6A taken along a line I-I' shown in FIG. 6A, according to an embodiment.

Figure 6B:
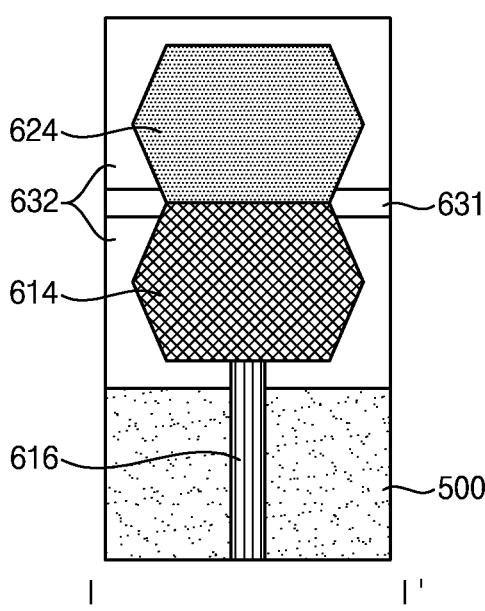
FIG. 6B illustrates a cross-sectional view of the multi-stack semiconductor device of FIG. 6A taken along a line I-I' shown in FIG. 6A, according to an embodiment.

Referring to FIGS. 6A and 6B, a multi-stack semiconductor device 60 may have the same or similar multi-stack structure as the multi-stack semiconductor device 50 shown in FIGS. 5A and 5B. Thus, materials and methods forming a substrate 600, a lower upper field-effect transistors 610 and an upper lower field-effect transistor 620 in the multi-stack semiconductor device 60 may be the same as or similar to those of the multi-stack semiconductor device 50. Thus, duplicate descriptions are not provided herein for gate structures 611 and 621, channel structures 612 and 622, $1^{st}$ to $4^{th}$ source/drain regions 613, 614, 623 and 624, and $1^{st}$ and $3^{rd}$ contact structures 615 and 625.

However, in the multi-stack semiconductor device 60, the $2^{nd}$ contact structure 616 may be extended from below the lower field-effect transistor 610, for example, inside the substrate 600 to be connected to a bottom portion or surface of the $2^{nd}$ source/drain region 614, according to an embodiment. That is, like the $1^{st}$ contact structure 615, the $2^{nd}$ contact structure 616 may also be formed as a BSPDN structure in the present embodiment to achieve utility of the substrate 600 and additional device density.

The above-described BSPDN structure may also apply to the multi-stack semiconductor device 60 shown in FIGS. 4A and 4B, as described below.

Figure 7A:
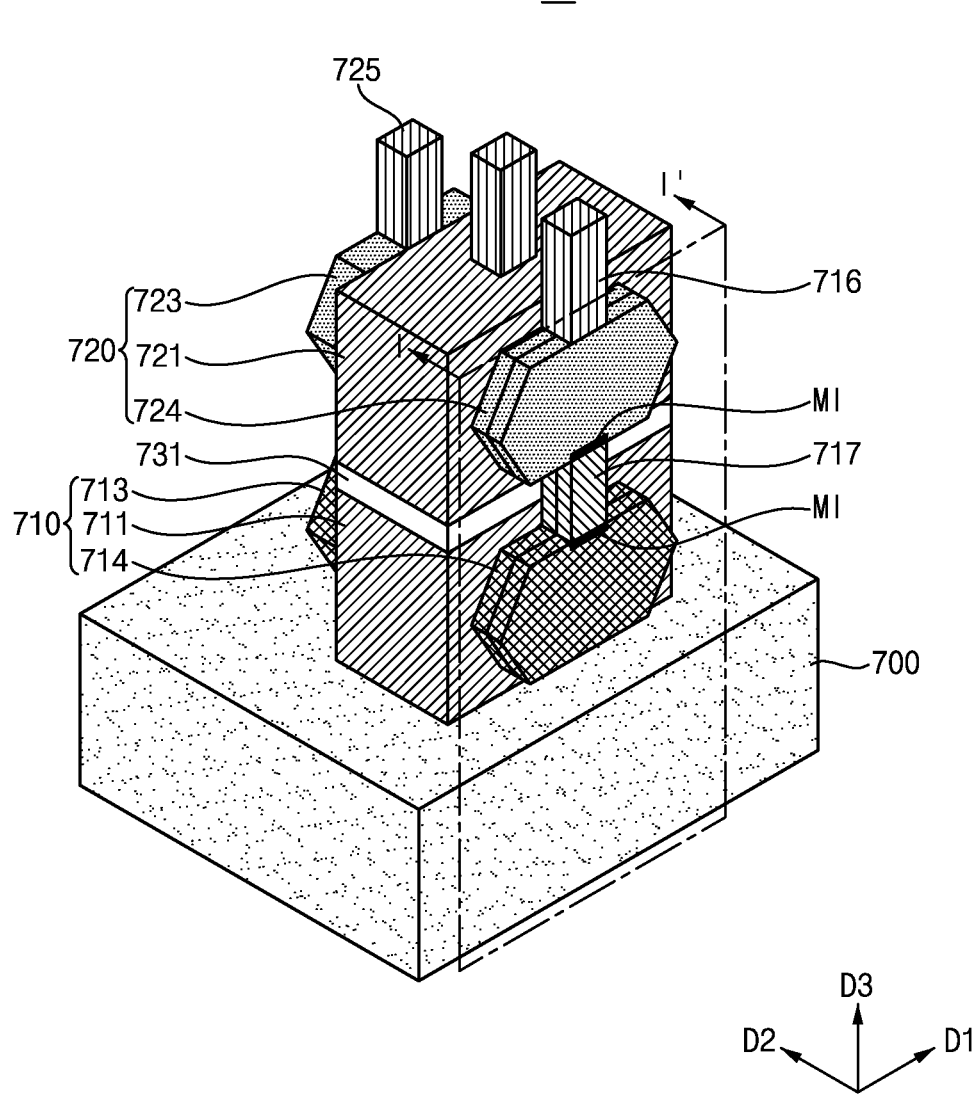
FIG. 7A illustrates a perspective view of a multi-stack semiconductor device including lower and upper field-effect transistors, according to still another embodiment.
Figure 7B:
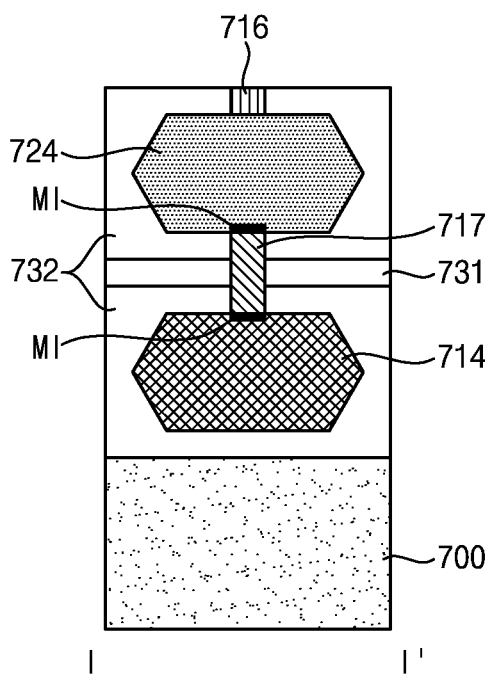
FIG. 7B illustrates a cross-sectional view of the multi-stack semiconductor device of FIG. 7A taken along a line I-I' shown in FIG. 7A, according to an embodiment.

FIG. 7A illustrates a perspective view of a multi-stack semiconductor device including lower and upper field-effect transistors, according to still another embodiment. FIG. 7B illustrates a cross-sectional view of the multi-stack semiconductor device of FIG. 7A taken along a line I-I' shown in FIG. 7A, according to an embodiment.

Referring to FIGS. 7A and 7B, a multi-stack semiconductor device 70 may have the same or similar multi-stack structure as the multi-stack semiconductor device 50 shown in FIGS. 5A and 5B. Thus, materials and methods forming a substrate 700, a lower upper field-effect transistors 710 and an upper lower field-effect transistor 720 in the multi-stack semiconductor device 70 may be the same as or similar to those of the multi-stack semiconductor device 50. Thus, duplicate descriptions are not provided herein for gate structures 711 and 721, channel structures 712 and 722, $1^{st}$ to $4^{th}$ source/drain regions 713, 714, 723 and 724, and $1^{st}$ to $3^{rd}$ contact structures 715, 716 and 725.

However, in the multi-stack semiconductor device 70, the $2^{nd}$ and $4^{th}$ source/drain regions 714 and 724 are directly merged in the D3 direction through a supplemental connection structure 717 similar to the supplemental connection structure 417 included in the multi-stack semiconductor device 40 shown in FIGS. 4A and 4B. Materials and methods forming the supplemental connection structure 717 may be the same as or similar to those of the supplemental connection structure 417, and thus, duplicate descriptions are omitted herein.

Figure 8A:
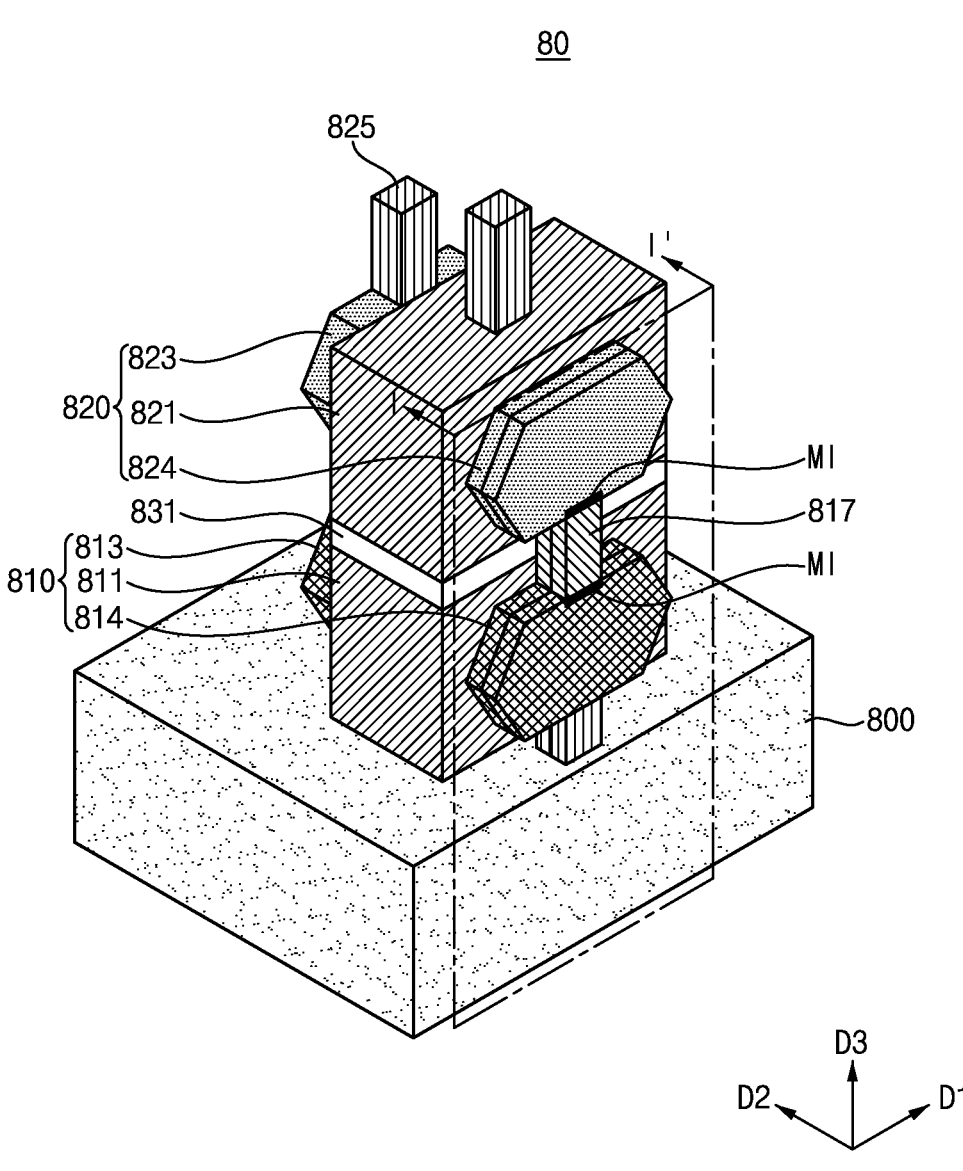
FIG. 8A illustrates a perspective view of a multi-stack semiconductor device including lower and upper field-effect transistors, according to still another embodiment.
Figure 8B:
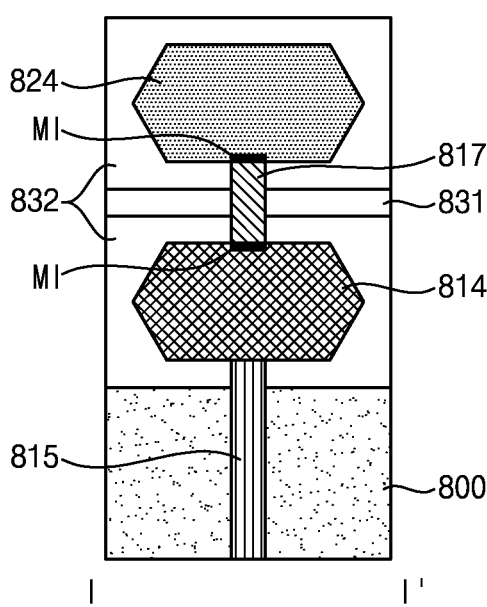
FIG. 8B illustrates a cross-sectional view of the multi-stack semiconductor device of FIG. 8A taken along a line I-I' shown in FIG. 8A, according to an embodiment.

FIG. 8A illustrates a perspective view of a multi-stack semiconductor device including lower and upper field-effect transistors, according to still another embodiment. FIG. 8B illustrates a cross-sectional view of the multi-stack semiconductor device of FIG. 8A taken along a plane I-I' shown in FIG. 8A, according to an embodiment.

Referring to FIGS. 8A and 8B, a multi-stack semiconductor device 80 may have the same or similar multi-stack structure as the multi-stack semiconductor device 70 shown in FIGS. 7A and 7B. Thus, materials and methods forming a substrate 800, a lower upper field-effect transistors 810 and an upper lower field-effect transistor 820 in the multi-stack semiconductor device 80 may be the same as or similar to those of the multi-stack semiconductor device 70. Thus, duplicate descriptions are not provided herein for gate structures 811 and 821, channel structures 812 and 822, $1^{st}$ to $4^{th}$ source/drain regions 813, 814, 823 and 824, and $1^{st}$ and $3^{rd}$ contact structures 815 and 825.

However, in the multi-stack semiconductor device 80, the $2^{nd}$ contact structure 816 may be extended from below the lower field-effect transistor 810, for example, inside the substrate 800 to be connected to a bottom portion or surface of the $2^{nd}$ source/drain region 814, according to an embodiment. That is, like the $1^{st}$ contact structure 815, the $2^{nd}$ contact structure 816 may also be formed as a BSPDN structure in the present embodiment to achieve utility of the substrate 800 and additional device density.

In the above embodiments, the upper field-effect transistor and the lower field-effect transistor forming each of the multi-stack semiconductor devices 10 to 80 are described as a p-type and an n-type, respectively. However, the disclosure may also apply to multi-stack semiconductor devices in which an upper field-effect transistor and a lower field-effect transistor are the n-type and the p-type, respectively, according to embodiments. Further, although the above multi-stack semiconductor devices 10 to 80 are described as including nanosheet transistors at lower and upper stacks. However, the disclosure may also apply to multi-stack semiconductor device in which an upper stack and a lower stack are constituted by respective FinFETs or a combination of a FinFET and a nanosheet transistor, according to embodiments.

Figure 9:
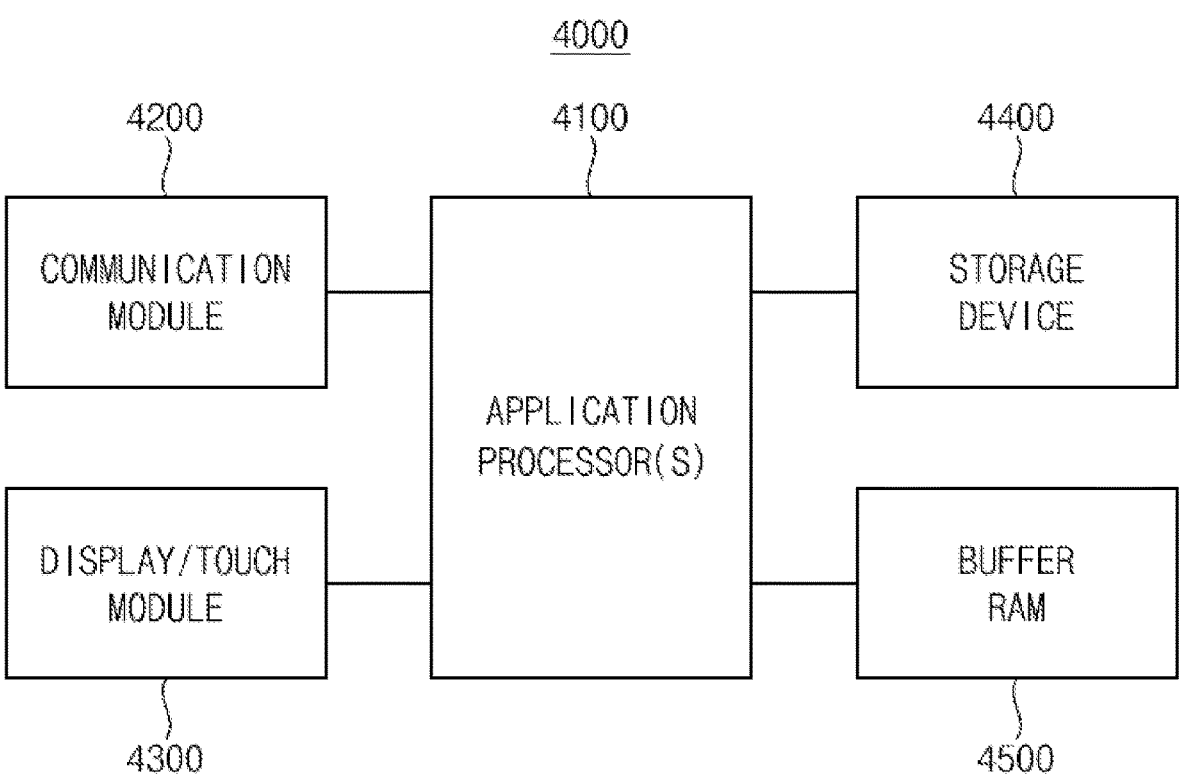
FIG. 9 is a schematic block diagram illustrating an electronic device in which at least one multi-stack semiconductor device shown in at least one of FIGS. 1A-1C to 7A and 7B, according to an example embodiment.

FIG. 9 is a schematic block diagram illustrating an electronic device in which at least one multi-stack semiconductor device shown in at least one of FIGS. 1A-1C to 8A and 8B, according to an example embodiment.

Referring to FIG. 9, an electronic device 4000 may include at least one application processor 4100, a communication module 4200, a display/touch module 4300, a storage device 4400, and a buffer random access memory (RAM) 4500. The electronic device 4000 may be a mobile device such as a smartphone or a tablet computer, not being limited thereto, according to embodiments.

The application processor 4100 may control operations of the electronic device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the electronic device 4000. For example, the buffer RAM 4500 may be volatile memory such as static random access memory (SRAM), double data rate (DDR) synchronous dynamic random access memory (SDRAM), low power double data rate (LPDDR) SDRAM, graphics double data rate (GDDR) SDRAM, Rambus dynamic random access memory (RDRAM), etc.

Although not shown in FIG. 9, the electronic device 4000 may further include at least one sensor such as an image sensor. In this case, the multi-stack semiconductor device shown in at least one of FIGS. 1A-1C to 8A and 8B may constitute a complementary-metal-oxide-semiconductor (CMOS) device, and the image sensor of the electronic device 400 may be a CMOS image sensor, according to an embodiment.

At least one component in the electronic device 4000 may include at least one of the multi-stack semiconductor devices shown in FIGS. 1A-1C to 8A and 8B.

The foregoing is illustrative of exemplary embodiments and is not to be construed as limiting the inventive concept. Although a few exemplary embodiments have been described, those skilled in the art will readily appreciate that many modifications are possible in the above embodiments without materially departing from the inventive concept.

What is claimed is:

1. A multi-stack semiconductor device comprising:

a substrate;

a lower field-effect transistor comprising a lower channel structure, a lower gate structure surrounding the lower channel structure, and $1^{st}$ and $2^{nd}$ source/drain regions; and an upper field-effect transistor, on the lower field-effect transistor, comprising an upper channel structure, an upper gate structure surrounding the upper channel structure, and $3^{rd}$ and $4^{th}$ source/drain regions vertically above the $1^{st}$ and $2^{nd}$ source/drain regions, respectively, wherein the $1^{st}$ source/drain region is connected to a $1^{st}$ one of a positive voltage source and a negative voltage source, and the $3^{rd}$ source/drain region is connected to a $2^{nd}$ one of the positive voltage source and the negative voltage source different from the $1^{st}$ one, wherein the multi-stack semiconductor device further comprises a connection structure of which a $1^{st}$ end is on a top portion of the $2^{nd}$ source/drain region and a $2^{nd}$ end is on a bottom portion of the $4^{th}$ source/drain region facing the top portion of the $2^{nd}$ source/drain region to connect the top portion of the $2^{nd}$ source/drain region and the bottom portion of the $4^{th}$ source/drain region, and wherein a width of the $2^{nd}$ source/drain region is different from a width of the $4^{th}$ source/drain region.

2. The multi-stack semiconductor device of claim 1, wherein the connection structure connects the $4^{th}$ source/drain region to the $2^{nd}$ source/drain region based on an ohmic contact, and wherein the connection structure comprises a semiconductor material.

3. The multi-stack semiconductor device of claim 1, wherein the connection structure comprises a metal or a metal compound, wherein the top portion of the $2^{nd}$ source/drain region comprises a metal ion implanted therein and contacting the $1^{st}$ end of the connection structure, wherein the bottom portion of the $4^{th}$ source/drain region comprises another metal ion implanted therein and contacting the $2^{nd}$ end of the connection structure.

4. The multi-stack semiconductor device of claim 1, further comprising a $1^{st}$ contact structure connected to the $2^{nd}$ or $4^{th}$ source/drain region, wherein the $1^{st}$ contact structure is configured to output an output signal of the multi-stack semiconductor device from the $2^{nd}$ or $4^{th}$ source/drain region.

5. The multi-stack semiconductor device of claim 4, further comprising:

a $2^{nd}$ contact structure connecting the $1^{st}$ source/drain region to the $1^{st}$ one of the positive voltage source and the negative voltage source; and a $3^{rd}$ contact structure connecting the $3^{rd}$ source/drain region to the $2^{nd}$ one of the positive voltage source and the negative voltage source, wherein the $2^{nd}$ contact structure is at least partially buried in the substrate, and wherein the $3^{rd}$ contact structure is on a top portion of the $3^{rd}$ source/drain region.

6. The multi-stack semiconductor device of claim 1, further comprising a $1^{st}$ contact structure connected to the $2^{nd}$ source/drain region, and at least partially buried in the substrate, wherein the $1^{st}$ contact structure is configured to output an output signal of the multi-stack semiconductor device from the $2^{nd}$ source/drain region.

7. The multi-stack semiconductor device of claim 6, further comprising:

a $2^{nd}$ contact structure connecting the $1^{st}$ source/drain region to the $1^{st}$ one of the positive voltage source and the negative voltage source; and a $3^{rd}$ contact structure connecting the $3^{rd}$ source/drain region to the $2^{nd}$ one of the positive voltage source and the negative voltage source, wherein the $2^{nd}$ contact structure is at least partially buried in the substrate, and wherein the $3^{rd}$ contact structure is on a top portion of the $3^{rd}$ source/drain region.

8. The multi-stack semiconductor device of claim 1, wherein the width of the $2^{nd}$ source/drain region is greater than the width of the $4^{th}$ source/drain region.

9. The multi-stack semiconductor device of claim 1, wherein the lower channel structure comprises a lower nanosheet layer, and the upper channel structure comprises an upper nanosheet layer, and wherein a width of the lower nanosheet layer is different from a width of the upper nanosheet layer.

10. The multi-stack semiconductor device of claim 9, wherein the width of the lower nanosheet layer is greater than the width of the upper nanosheet layer.

11. The multi-stack semiconductor device of claim 9, wherein the lower nanosheet layer is one of a plurality of lower nanosheet layers included in the lower channel structure, wherein the upper nanosheet layer is one of a plurality of upper nanosheet layers included in the upper channel structure, and wherein a number of the plurality of lower nanosheet layers is different from a number of the plurality of upper nanosheet layers.

12. The multi-stack semiconductor device of claim 11, wherein the number of the plurality of lower nanosheet layers is less than the number of the plurality of upper nanosheet layers.

13. A multi-stack semiconductor device comprising:

a lower-stack transistor structure having a $1^{st}$ conductivity type; and an upper-stack transistor structure having a $2^{nd}$ conductivity type opposite the 1st conductivity type, wherein a $1^{st}$ source/drain region of the lower-stack transistor structure is provided vertically below a $2^{nd}$ source/drain region of the upper-stack transistor structure, wherein the $1^{st}$ source/drain region and the $2^{nd}$ source/drain region are connected through a connection structure connecting a metal ion at least partially embedded within a top portion of the $1^{st}$ source/drain region and another metal ion at least partially embedded within a bottom portion of the $2^{nd}$ source/drain region, and wherein the connection structure comprises a metal or a metal compound.

14. The multi-stack semiconductor device of claim 13, wherein a $1^{st}$ end of the connection structure contacts the top portion of the $1^{st}$ source/drain region, and a $2^{nd}$ end of the connection structure contacts the bottom portion of the $2^{nd}$ source/drain region, and wherein the metal ion at least partially embedded within the top portion of the 1st source/drain region is included in a metal ion implantation structure, with the metal ion implantation structure aligned with the $1^{st}$ end of the connection structure.

15. The multi-stack semiconductor device of claim 13, further comprising a contact structure connected to the $1^{st}$ or $2^{nd}$ source/drain region, wherein the multi-stack semiconductor device is configured to operate as an inverter circuit, and wherein the contact structure is configured to output an output signal of the inverter circuit.

16. The multi-stack semiconductor device of claim 15, wherein the contact structure is connected to the $1^{st}$ source/drain region, and at least partially buried in a substrate below the lower-stack transistor structure.

17. The multi-stack semiconductor device of claim 13, wherein the metal ion at least partially embedded within the top portion of the $1^{st}$ source/drain region is included in a metal ion implantation structure, and wherein the metal ion implantation structure is spaced apart from opposing side surfaces of the $1^{st}$ source/drain region.

18. A multi-stack semiconductor device comprising:

a substrate;

a lower field-effect transistor on the substrate, the lower field-effect transistor comprising a lower channel structure, a lower gate structure on the lower channel structure, and $1^{st}$ and $2^{nd}$ source/drain regions;

an upper field-effect transistor on the lower field-effect transistor, the upper field-effect transistor comprising an upper channel structure, an upper gate structure on the upper channel structure, and $3^{rd}$ and $4^{th}$ source/drain regions; and a contact structure connected to a bottom portion of the $2^{nd}$ source/drain region and at least partially buried in the substrate, the contact structure configured to receive an output signal of the multi-stack semiconductor device via the $2^{nd}$ source/drain region and to output the output signal, wherein the $1^{st}$ source/drain region is connected to a $1^{st}$ voltage source, and the $3^{rd}$ source/drain region is connected to a $2^{nd}$ voltage source different from the $1^{st}$ voltage source, wherein a top portion of the $2^{nd}$ source/drain region and a bottom portion of the $4^{th}$ source/drain region are connected to each other, wherein the lower channel structure comprises a lower nanosheet layer, and the upper channel structure comprises an upper nanosheet layer, and wherein a width of the lower nanosheet layer is different from a width of the upper nanosheet layer.

19. The multi-stack semiconductor device of claim 18, wherein the multi-stack semiconductor device is configured to operate as an inverter circuit, and wherein the contact structure is configured to output the output signal of the inverter circuit.

20. The multi-stack semiconductor device of claim 18, wherein each of the lower gate structure and the upper gate structure comprises a metal material.

* * * * *